United States Patent
Gennari

(10) Patent No.: US 7,155,698 B1
(45) Date of Patent: Dec. 26, 2006

(54) METHOD OF LOCATING AREAS IN AN IMAGE SUCH AS A PHOTO MASK LAYOUT THAT ARE SENSITIVE TO RESIDUAL PROCESSING EFFECTS

(75) Inventor: Frank E. Gennari, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 431 days.

(21) Appl. No.: 10/716,266

(22) Filed: Nov. 17, 2003

Related U.S. Application Data

(63) Continuation-in-part of application No. 10/241,242, filed on Sep. 10, 2002, now Pat. No. 7,030,997.

(60) Provisional application No. 60/322,381, filed on Sep. 11, 2001.

(51) Int. Cl.
    *G06F 17/50* (2006.01)
(52) U.S. Cl. .......................................... 716/19; 716/20
(58) Field of Classification Search ............. 716/19–21
    See application file for complete search history.

(56) References Cited

U.S. PATENT DOCUMENTS

| | | | |
|---|---|---|---|
| 5,455,427 A * | 10/1995 | Lepselter et al. | 250/492.23 |
| 5,539,752 A * | 7/1996 | Berezin et al. | 714/724 |
| 6,301,697 B1 | 10/2001 | Cobb | |
| 6,430,737 B1 | 8/2002 | Cobb et al. | |
| 7,003,757 B1 * | 2/2006 | Pierrat et al. | 716/19 |
| 2003/0061583 A1 * | 3/2003 | Malhotra | 716/5 |
| 2003/0126581 A1 * | 7/2003 | Pang et al. | 716/19 |

* cited by examiner

*Primary Examiner*—Stacy A. Whitmore
(74) *Attorney, Agent, or Firm*—Beyer Weaver & Thomas LLP

(57) ABSTRACT

Images such as mask layouts, signatures, and photographs are compared to identify similarities or dissimilarities in the images. Descriptions of the images use geometric shapes including lines, rectangles, and triangles to facilitate the comparisons and decrease comparison time and decrease stored data describing the shapes. Data for pixels in the shapes are pre-integrated to reduce arithmetic operations in the comparisons.

26 Claims, 20 Drawing Sheets

Generic Pattern Matching Code

1. Divide input shapes (polygons) into geometric primitives

2. Spatially organize primitives by x, y, etc.

3. Compute Match Factor (MF):
   for each pattern P
      for each orientation of P
         for each match type T
            for each X,Y match location
               for each geom. Primitive G overlapping P at X,Y
                  add contribution of G on P at X,Y to MF Time dominated by #3: #patterns x #orientations x #types x #locations x #primitives_overlap_pattern x time(primitive)

*FIG. 6*

Data Structures

- Input = polygons, rectangles (special case of a polygon), paths (can be converted to polygons), and circles (can be approximated by many-sided polygons) = polygons

- Geometric Primitives:

| Type | Number in layout | Operations to add to MF (time) |
|---|---|---|
| Pixel (Bitmap Alg.) | Very Large (area) | 1 |
| Edge Intersection | Large (perimeter) | 2 |
| Rectangle | Medium | 4 |
| Triangle | Small (or none) | 4 to 12 (if split) |

- Higher-level primitives (lower in table) are much more efficient to store and use

*FIG. 7*

Polygon Splitting (Bitmap)

- Manhattan Polygon => Bitmap
  - Too many pixels to store – large blocks of the same value

Polygon Splitting (Rectangles)

- Manhattan Polygon => Rectangles

- Non-Manhattan Polygon => Rectangles

Algorithm 1: Bitmap

- Entire layout represented as one huge bitmap of layers (like images on a computer screen)
- One rectangle is added at a time to the bitmap
- At every match location (edge, corner, etc.), each pattern pixel is multiplied by the layout pixel and summed:

$$MF(i+\frac{X}{2}, j+\frac{Y}{2}) = norm * \sum_{Y} \sum_{X} Layout(x+i, y+j) * Pat(x,y)$$

- Pattern size (X by Y) is typically 128x128
  = 16384 ops

Algorithm 2: Edge Intersections

- Store only the pixels along edges
- Run-length encoding in 1D – skip large runs of the same pixel value (rectangle strips)
- Pre-integrate pattern in 1D: $val(i,j) = \sum_{k=i}^{x} pat(k,j)$ for x intersection case
- Add MF contributions from each rectangle strip between two edges (either X or Y dir)

| pat(...,j) | 0 | 1 | 2 | 1 | 3 | 0 | 1 |
|---|---|---|---|---|---|---|---|
| val(...,j) | 8 | 8 | 7 | 5 | 4 | 1 | 1 | r strip (weight 1) | 1 |   |   |   |   | -1 |

+ edges  -

Contribution:
1*8 + (-1)*1 = 7

*FIG. 14*

Algorithm 3: Rectangles

- Simplest data structure: Store only the rectangles and pointers to them
- 2D encoding – only rectangle corners are needed
- Pattern integrated in 2D, rectangle LL corner clipped to pattern area
- Integrated pattern value is sum of values above and to the right: $val(i,j) = \sum_{l=j}^{Y} \sum_{k=i}^{X} pat(k,l)$

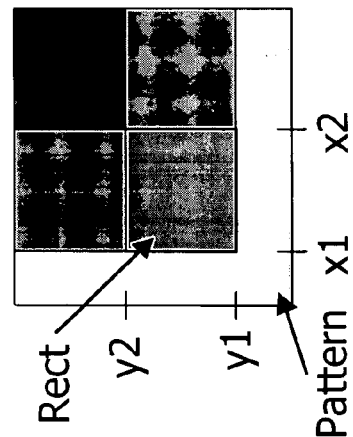

Contribution from rect at (x1,y1), (x2,y2) =
val(x1,y1) – val(x2,y1) – val(x1,y2) + val(x2,y2)

Only process LL corner and other 3 if inside pattern

*FIG. 15*

Algorithm 3b: Triangles

- Extension of rectangle algorithm
- Pre-integration time/storage proportional to the number of unique angles
  - Limited to multiples of 45-degree angles in practice
    - 0, 45, 90, 135, 180, 225, 270, 315 deg => 8 preintegrations

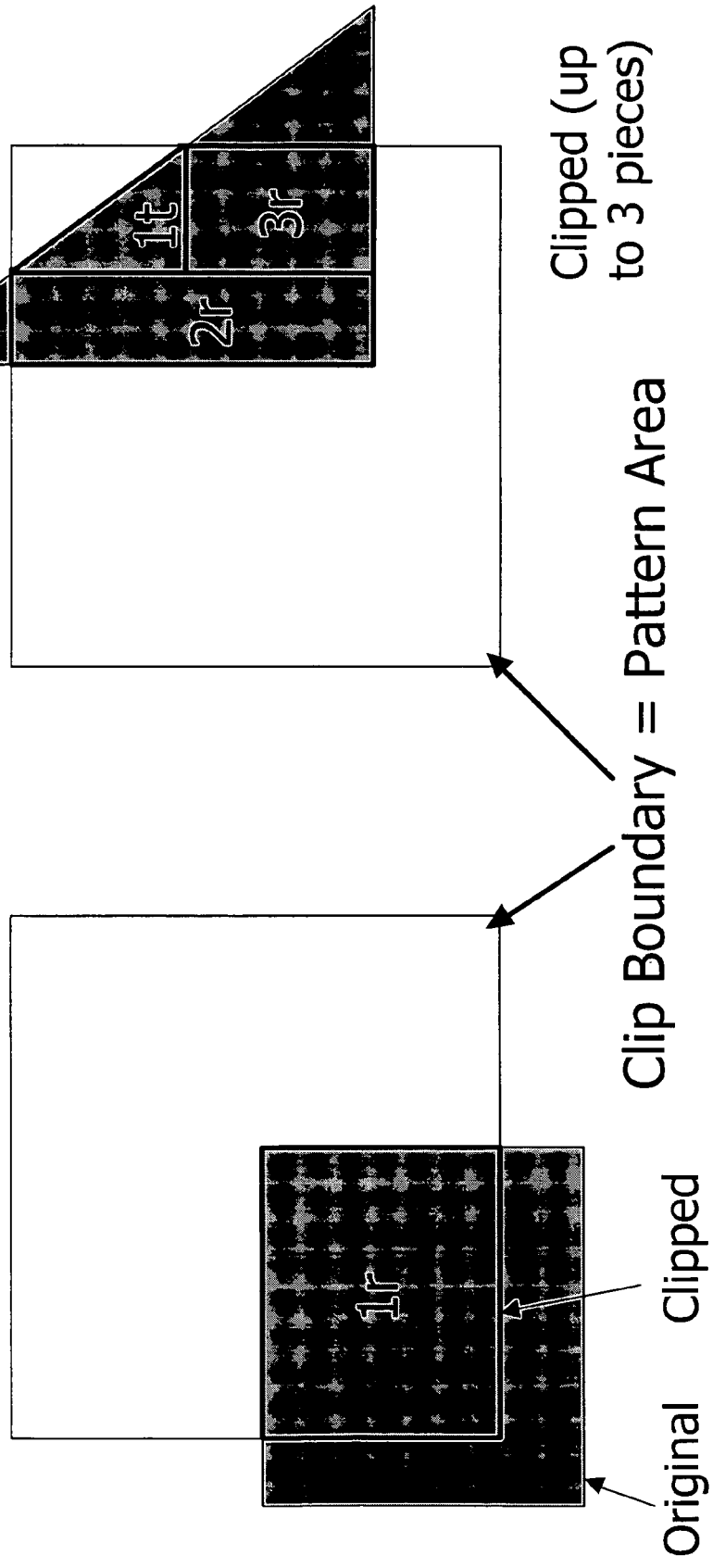

Examples

RL = rectangle length (3)
RH = rectangle height (3)
TL = triangle length (3)
TH = triangle height (3)

Bitmap Algorithm

Pattern Values

| PV | | | |
|---|---|---|---|
| 0 | 1 | 2 | 1 |
| 3 | 0 | 1 | 2 |
| 4 | 1 | 1 | 2 |
| 2 | 2 | 0 | 0 |

(3+0+1) + (4+1+1) + (2+2+0) = 14
RL*RH = 9 Operations

Edge Intersection

1D Pre-Int to the right

| | | | IR |
|---|---|---|---|
| 4 | 4 | 3 | 1 |
| 6 | 3 | 3 | 2 |
| 8 | 4 | 3 | 2 |
| 4 | 2 | 0 | 0 |

(6−2) + (8−2) + (4−0) = 14
2*RH = 6 Operations

Examples

1D Pre-Int to the right
IR

| 4 | 3 | 1 |
|---|---|---|
| 6 | 3 | 2 |
| 8 | 3 | 2 |
| 4 | 0 | 0 |

2D Pre-Int top right
P0

| 4 | 4 | 3 | 1 |
|---|---|---|---|
| 10 | 7 | 6 | 3 |
| 18 | 11 | 9 | 5 |
| 22 | 13 | 9 | 5 |

Non-45 degree Triangle (Proposed)

P0(A) − P0(B) − IR(B...C) =
18 − 0 − (4 + 3 + 3) = 8
TH + 2 = 5 Operations

Similar to edge intersection algorithm but reduced storage

METHOD OF LOCATING AREAS IN AN IMAGE SUCH AS A PHOTO MASK LAYOUT THAT ARE SENSITIVE TO RESIDUAL PROCESSING EFFECTS

CROSS-REFERENCES TO RELATED APPLICATIONS

This application claims priority as a continuation-in-part of patent application Ser. No. 10/241,242, filed Sep. 10, 2002 now U.S. Pat. No. 7,030,997, which claims the benefit of provisional application Ser. No. 60/322,381, filed Sep. 11, 2001, and which are incorporated herein by reference for all purposes.

STATEMENT AS TO RIGHTS TO INVENTIONS MADE UNDER FEDERALLY SPONSORED RESEARCH OR DEVELOPMENT

The U.S. Government has rights in the disclosed invention pursuant to DARPA Grant MDA 972-01-1-0021 to the University of California at Berkeley.

BACKGROUND OF THE INVENTION

This invention relates generally to imaging lens systems and photo masks for optically defining patterns, and more particularly the invention relates to integrated circuit mask analysis and locating areas in a mask that are sensitive to residual processing effects. The invention has applicability in other image analysis, including signature analysis, for example.

In the fabrication of electronic integrated circuits, line patterns of less than a tenth of a micron are now being developed. This is less than 1/500 the width of a human hair. At these dimensions, the projection printing of mask patterns in integrated circuit layout can be adversely impacted by small residual aberrations in the lens system. While the quality metric (Strehl ratio) of today's projection printers is within a few percent of unity, residual aberrations still contribute significant spillover of signals from one mask opening to another. These spillover effects degrade the image quality with position within the field of the die. Good correlation of measured aberrations with the difference in horizontal and vertical linewidth along the slit in a scanning system has been observed. Such aberration-based linewidth variations are themselves partially mitigated by higher image slopes created through optical proximity correction (OPC). Yet residual cross-chip linewidth variations suggest that residual aberrations continue to contribute a level of degradation that is about half as large as the level of improvement gained through applying OPC. The impact of these aberration-based spillover effects will clearly become more important with phase shifting masks due to the inherent use of more coherent illumination as well as the presence of both phases to more efficiently direct energy to a broader set of locations in the lens pupil. Since lithography at low kl and high NA is adversely affected by small residual aberrations in lenses even though Strehl ratios exceed 0.98, test targets are needed to act as 'canaries' that are more sensitive than product features as well as to quantify individual aberrations to $0.01\lambda$ mms.

Co-pending application Ser. No. 10/241,242, supra, is concerned with characterizing a lens and lens system as to aberrations through the use of a probe and surrounding pattern by illuminating a mask having a small opening (probe) and a surrounding adjacent open geometry (pattern). The combined intensity pattern at the probe position near an image plane of the lens is then observed for spillover from the surrounding pattern that occurs as light passes through the lens. For this application, patterns corresponding to the inverse Fourier transform (IFT) of aberration representations used in characterizing lenses can be utilized. This gives an indication of the presence and level of lens aberrations, such as coma, astigmatism, spherical, and trifoil or even multiple terms in the Zernike representation. Measurements of the combined image compared to the individual image of the probe and pattern thus contain quantitative information on the level of aberrations. This intensity change can be observed directly by signal detection or indirectly by, for example in lithography, performing wafer exposures at various doses and comparing the dose at which the various parts of the image print in photoresist with the dose required to clear large areas or isolated probes.

The application also discloses a pattern-matching method for predicting worst case locations of residual aberration induced feature changes in the projection printing of large layouts including chip layouts used in integrated circuit manufacturing. A CAD system can rapidly determine locations in large layouts that are most impacted by aberrations in projection printing. For this application, aberrations are accurately modeled as producing spillover between mask openings with a localized pattern that is the inverse Fourier transform (IFT) of the optical path difference (OPD) function in the lens. The novel function in the CAD system then quickly rank orders all pattern edges and corners of interest according to the degree of similarity of their surrounding layout to the IFT function.

In carrying out the pattern matching the application discloses a bitmap matrix algorithm in which a bitmap of the layout is multiplied with the test pattern bitmap to compute the final match factor at each layout pixel of interest. The entire mask layout is represented as one huge bitmap of layers, similar to images on a computer screen. At every match location of interest (e.g., edge, corner) each pattern pixel is multiplied by the layout pixel at that coordinate and summed. However, the bitmap algorithm is too slow and too data intensive.

The present invention is directed to proving new algorithms based on edges, rectangles and triangles, which more efficiently compute match factors for a large number of test points.

BRIEF SUMMARY OF INVENTION

In accordance with the invention, new algorithms have been created to replace the inefficient bitmap-based algorithms in pattern matching. One new algorithm is based on extracting edges from the geometry, pre-integrating the pattern in one dimension, and adding contributions from each pixel wide strip between two edges of each shape overlapping the pattern. Another new algorithm takes the method one step further to the rectangles themselves, pre-integrating the pattern in two dimensions and adding contributions from each rectangle in the input geometry that overlaps the pattern. Performance analysis shows that both algorithms reduce the computational complexity of pattern matching, thus dramatically reducing both runtime and memory usage. The rectangle algorithm is the most efficient for typical layouts, so additional features such as layer Booleans, overlap removal, match filtering, and several speedup methods have been adapted to work with the rectangle data structure. The invention can be extrapolated to triangle primitives for polygons with diagonal lines.

The two new algorithms based on edges and on rectangles efficiently compute the match factor (MF) for a large number of test points. The edge algorithm comprises first extracting either horizontal, vertical, or both orientations of edges from each polygon, path, or rectangle in the input layout. Diagonal edges are split into horizontal and vertical segments on fixed grid spacing, leading to a stair step of orthogonal segments. The edges are then split into segments of length one grid unit, sorted, and stored in an array for each grid scanline of the layout. The pattern is pre-integrated in one dimension so that in one embodiment, each new pixel is equal to the sum of the pixels to the right of it (for vertical edges). Then, for each grid line in the pattern (row of pixels), the edge segments along that line are iterated through, multiplied by the integrated pixel value, and summed to compute the match factor at that point.

The rectangle-based algorithm extracts rectangles from the geometry and sorts them by location. Polygons and other non-rectangular shapes are split into a near minimum number of rectangles and snapped to the nearest grid coordinates. The layout is partitioned and polygons are extracted one partition at a time prior to splitting. Each partition is further divided into regions equal in size to the largest pattern used for matching. When the pattern is laid over the geometry, it can thus overlap at most a 2×2 group of regions. Each region is associated with an array containing the indices of each rectangle overlapping that region, and another data structure is built to contain a unique list of the rectangles overlapping any group of 2×2 regions. This final data structure can be used to iterate through all the rectangles overlapping the pattern by looking into the array representing the group of four regions that the pattern overlaps. In this algorithm the pattern is integrated in two dimensions so that the integrated value of a pixel P(x,y) equals the sum of all pixels both above and to the left of the point, including the point itself. The weight of the pattern pixels under a rectangle at (x1,y1), (x2,y2) is $PW(r)=P(x1,y1)+P(x2,y2)-P(x1,y2)-P(x2,y1)$. Using this equation, each rectangle contributes a value of weight(r)*PW(r) to the match factor at that point. For layouts containing diagonal edges, a triangular algorithm can be used with the rectangular algorithm to further improve the speed and accuracy of pattern matching.

These algorithms have been analyzed on the basis of speed, memory requirements, and the ability to add in special features that improve the efficiency, functionality, or usability of the tool. It has been determined that the rectangle algorithm performs much better than the original bitmap algorithm and usually better than the edge algorithm on typical input layouts.

The features from the bitmap algorithm that have been successfully integrated into the rectangle code include layer Booleans, overlap removal, match filtering, match requirements, and extraction of geometry for SPLAT aerial image simulation. Layer Booleans and overlap removal are implemented efficiently using the same regions (working sets) from the rectangle algorithm described above. All pairs of rectangles within a region having identical layers are checked for Boolean operations and overlap. Since the regions are small, the rectangle count is usually low and these operations are relatively fast compared to the match factor computation time.

Match filtering is used to reduce the set of locations of interest to only inside corners, outside corners, edges, line ends, centers of line ends, and alternating edge points. The matching time is also reduced by a factor of two to five by using an adaptive match factor prediction and error bounds estimation. This allows the software to skip the computation of the match factor of points that are close to other locations of low value. Results employing the latest version of the rectangle algorithm show that all edges and line ends on a single layer mask of several square centimeters can be processed in less than an hour on a 1 GHz desktop PC.

The invention and objects and features thereof will be more readily apparent from the following detailed description and appended claims when taken with the drawings.

BRIEF DESCRIPTION OF THE DRAWINGS

FIG. 6 illustrates generic pattern matching code.

FIG. 7 illustrates data structure primitive comparisons.

FIG. 14 illustrates an edge intersection algorithm.

FIG. 15 illustrates a rectangle algorithm.

FIG. 17 illustrates rectangle/triangle clipping.

DETAILED DESCRIPTION OF THE INVENTION

Figure 1:
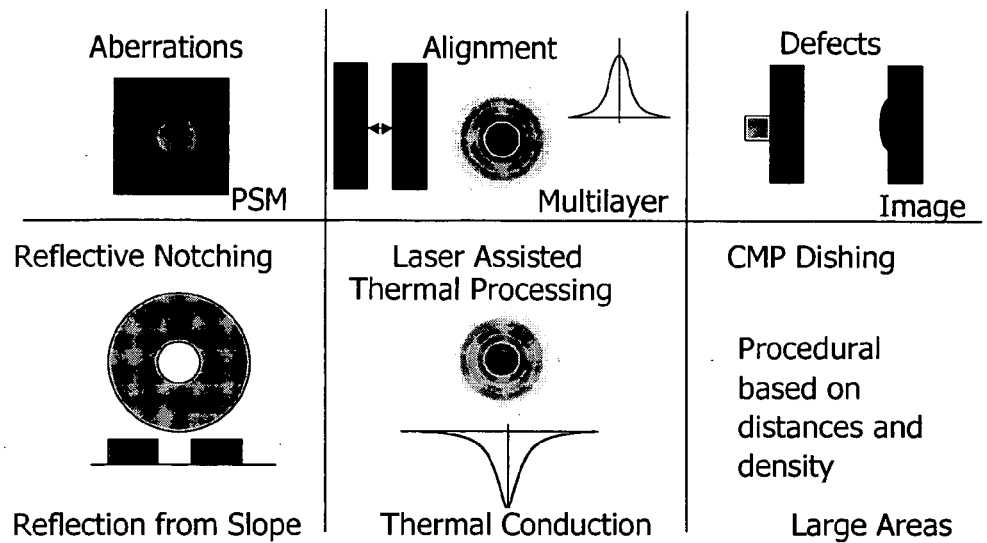
FIG. 1 illustrates pattern matcher test patterns for various applications of the invention.

As the critical dimension in optical lithography continues to shrink and additional phases are added to masks, it is becoming more important to determine where the geometry is affected the most by non-ideal process conditions. If the most problematic shapes can be identified and represented in an unambiguous form, then these test patterns can be used to locate areas in any layout that are the most sensitive to these effects. After the 'hot spots' have been found, the designer can go back and alter the geometry to reduce the sensitivity to these effects. Alternatively, these locations can be recorded and later examined after fabrication as a way to narrow down mask inspection regions. Locations of interest can be filtered to edges, line ends, inside corners, and/or outside corners.

In accordance with one application of the invention, a software system analyzes a mask layout and searches for locations sensitive to residual processing effects. Pattern matching is used to determine where the layout geometry most closely resembles the problematic shape. For example, locations in an integrated circuit design that are susceptible to lens aberrations can quickly be identified by examining the similarity of the layout geometry to those patterns developed for measuring aberrations. These shapes, or patterns, are generated via a list of Zernike polynomials (in the case of aberrations) or other 2D, user-defined test functions resembling the shape of the problematic layout geometry. These patterns represent the worst-case layout with respect to the processing effect. In the case of lens aberrations, the pattern to be matched is the inverse Fourier transform of the aberrated pupil function. The pattern matcher is capable of reading mask layouts with any number of layers in standard CIF and GDS/GDSII formats, compressing the data to conserve memory, and extracting geometry directly from the hierarchy. The goal of the invention is to find and rank order the locations of the worst-case effects in a full chip layout within a few hours on a standard desktop PC. The output of the software system is a text list of the top N match locations of highest match factors, extracted geometry files of the top match locations, and JPEG compressed images of the locations of interest with the pattern image overlaid on the layout. The designer can then use this sensitivity information to modify these selected geometries in the layout and reduce the unwanted processing effects.

CIF and GDSII layouts are imported and stored in hierarchical form. The layout area is partitioned into a number of equal sized squares that depends on the total area and user input memory bounds. Each partition is processed independently, with geometry extracted from that partition by determining which cells of the hierarchy and contained geometry overlap the partition's area. Then the geometry is locally flattened and broken into rectangles. This reduces the memory requirements to that of storing the hierarchical data and only a small fraction of processed data at one time. If the required memory is still too high, then the software will store the processed rectangle data on disk to be accessed when necessary. The rectangle data written to disk is stored as a single file with the beginning location of each partition saved in memory. Internally generated temporary rectangle data such as layer Boolean results can also be stored this way.

In the case of lens aberrations, the match shape is the inverse Fourier transform of the optical path difference function. This gives a circular bitmap match pattern of complex numbers where the magnitudes of the pixel contributions fall off with radius. A 128 by 128 pixel pattern yields reasonable speed vs. accuracy and is scaled to represent a radius of several wavelengths. Other applications of pattern matching include analyzing effects due to misalignment, defects, reflective notching, laser-assisted thermal processing, and CMP dishing. These match pattern functions are shown in FIG. 1. It may also be possible to use pattern matching to locate areas sensitive to flare. A more in-depth analysis of the potential applications of pattern matching is given in: A. Neureuther and F. Gennari, "No-Fault Assurance: Linking Fast Process CAD and EDA," SPIE 4889, October 2002.

Figure 2A:
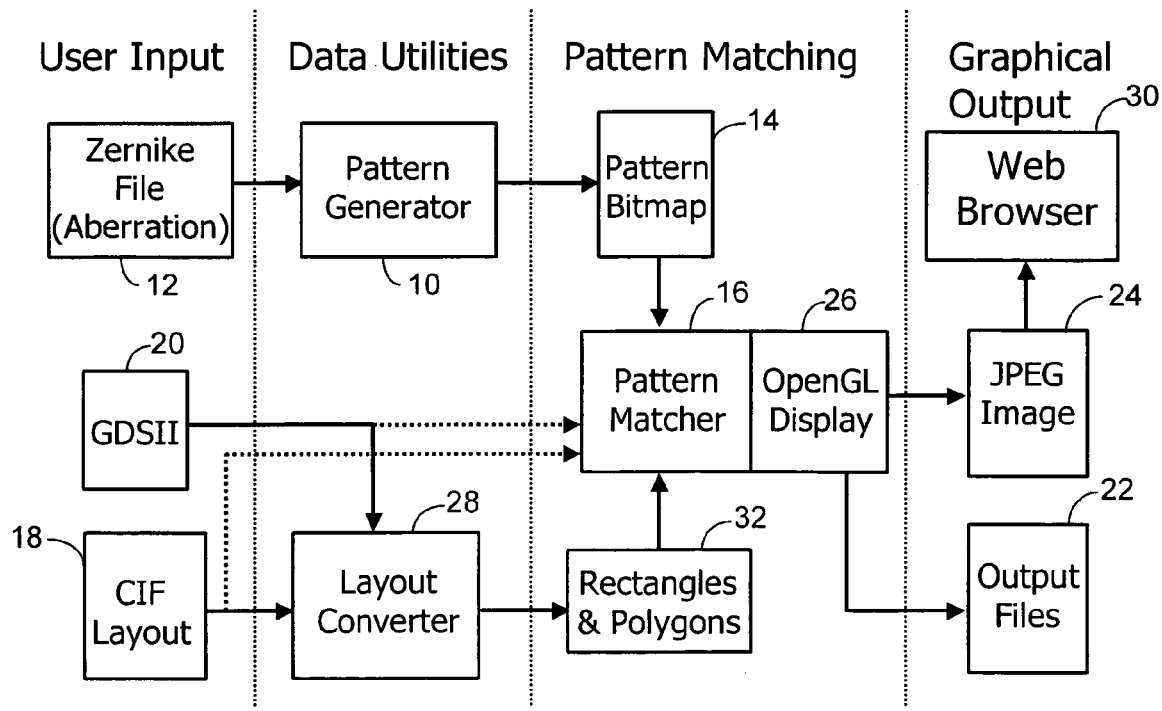
FIG. 2A is a functional block diagram of pattern matcher software in accordance with an embodiment of the invention.

A 2D pattern-matching algorithm has been developed to scan over the layout and compute, for each point of interest, the correlation of the actual local geometry to the shape of the test pattern(s). The goal of the software is to find and rank order the locations of the worst-case effects in a full chip layout based on the highest match factors. A block diagram of the pattern matcher is shown in FIG. 2A. The pattern generator 10 takes a set of Zernike polynomials 12 representing an aberrated pupil function, or any other user-defined equation, in order to generate the pattern bitmap 14. The main pattern matcher 16 executable then reads the pattern, a user input parameter file, and a (possibly multi-layer) mask layout in CIF 18, GDSII 20, or pattern matcher format. The pattern matcher is run, and a resulting sorted table of highest match factors for each pattern is output at 22 as well as JPEG images 24 of the patterns over the match locations. An arbitrary number of patterns can be used in one matching run and several layouts can be combined and run together. A graphics library 26 provides the system with capabilities for interactive graphical feedback.

In addition to the main matching programs, the system includes a tool for converting CIF (university format) and GDSII (EDA industry format) layouts into the internal layout format 28 of the pattern matcher. The pattern matching software also provides a graphical interface 30 for the user to view the layout with the highest scoring match locations highlighted. This software is available in several forms: a UNIX version integrated with the Cadence Design Framework II CAD tool, a standalone PC version with OpenGL GUI support, a web applet, and a newer step-by-step web interface. This allows remote users to input their layouts and aberrations into the system and take advantage of the full power of the tool.

The original algorithm disclosed in application Ser. No. 10/241,242 involved the construction of a bitmap representing the layout that was multiplied with the pattern bitmap to compute the final match factor at each layout pixel of interest. In accordance with the invention, a new algorithm 32 has been developed that, instead of computing a bitmap of the layout, only stores information about the feature edges in x and y intersection matrices. The new match factor is computed by pre-integrating the pattern and summing match factor contributions from each pattern strip between the edge intersections of each overlapping feature. Thus the runtime and storage requirements are dependent on the total perimeter of the layout instead of the area. This leads to one to two orders of magnitude of speedup and, using this algorithm, layouts as large as several square millimeters can be processed in just a few minutes.

Figure 2B:
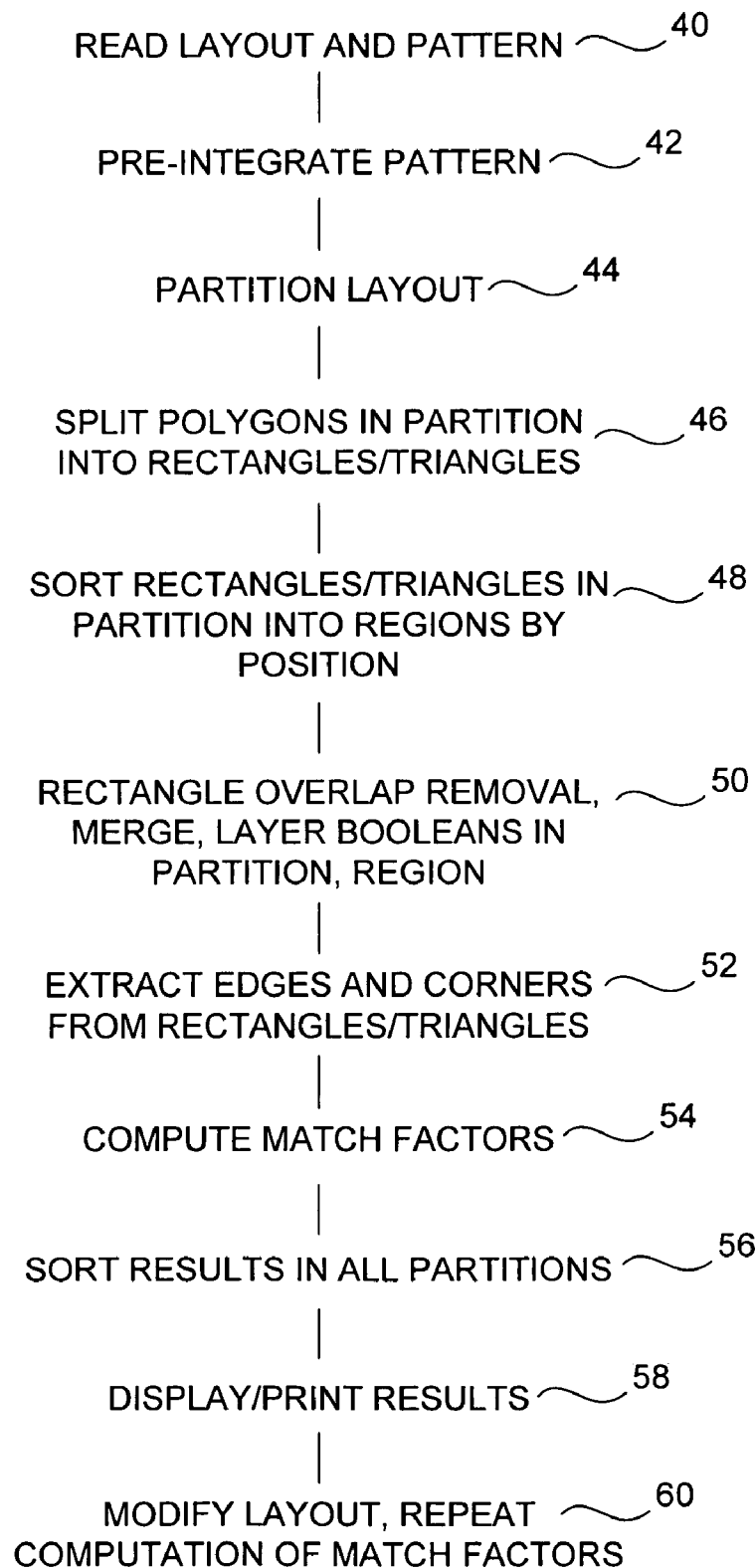
FIG. 2B is a flow diagram of steps in the mask pattern comparison.

FIG. 2B is a flow diagram of steps in the pattern matching in accordance with the invention. The digitized layout and pattern are read from storage at 40, and pre-integration of pixels in the pattern is made at 42. The layout is partitioned at 44 with polygons in each partition split into rectangles or triangles at 46. The rectangles/triangles in each partition are sorted into regions by position at 48 with removal of rectangle overlap, merge of geometric shapes, and generation of layer Boolean relationships in a partition at 50.

Thereafter, edges and corners are extracted from rectangles/triangles at 52, and match factors (MF) are computed on edges/corners in a partition at 54. The match factors are then sorted by score in all partitions at 56. The results can be displayed or printed at 58. Also, the results can be used to modify a layout at 60, and then the process is repeated iteratively for the modified layout.

In accordance with another embodiment of the invention, another algorithm has been developed that takes the pre-integration one step further, using 2D integration to process entire rectangles at a time. Thus the data structure now only contains information about the rectangles in a certain area of the geometry, which can be easily and quickly extracted directly from the hierarchy. Since the hierarchy is no longer flattened, the algorithm can run on any layout that will fit in memory in compact hierarchical form. The runtime of the rectangle-based algorithm is proportional to the number of match locations of interest multiplied by the match factor computation time per point. The match factor computation time is linear in the number of rectangles overlapping the pattern, which can be determined for each location in the layout in time linear in the number of total rectangles. This is effectively the "density" of the layout. The number of edge/line end match locations is approximately proportional to the number of rectangles in the layout assuming the edges are tested at regular intervals such as a fixed fraction of the minimum feature size. Therefore, the total runtime of the matching algorithm is proportional to the total number of rectangles times the density, which overall grows as the number of rectangles for a fixed technology design. Extracting a local set of rectangles from the hierarchy and preprocessing the data can take some time, but in practice the runtime is dominated by the matching loop due to the large constant term based on density.

The rectangle algorithm is by far the fastest and most efficient of the three. It is similar to the geometry processing algorithms used in OPC tools. Input layout primitives such as paths, polygons, and circles are split into rectangles, where non-orthogonal sides are converted to right triangles or split on a fine grid. Arbitrary shapes can be processed, though diagonal lines can lead to a large number of rectangles and/or triangles. After subdividing the layout into small regions of rectangles equal in area to the largest pattern, at most four regions overlap the pattern and thus it is easy to determine the rectangles and triangles whose weights contribute to the match factor at a collection of points. It is also easy to perform overlap removal, intersection tests, and layer Booleans on sets of rectangles. The only disadvantage to using rectangles is that it is difficult to determine which parts of each of a rectangle's sides are real edges or line ends and which corners appear on the periphery of the layout shapes. These operations are even more complex when they involve triangles as well.

Figure 3:
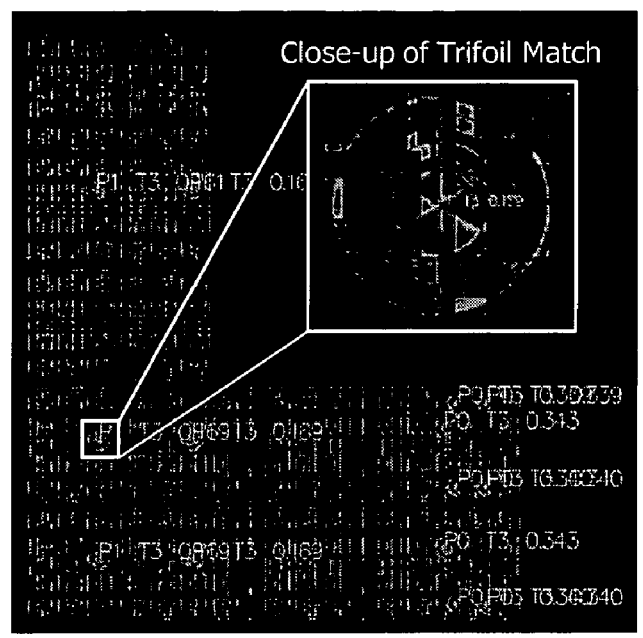
FIG. 3 illustrates trifoil and coma patterns matched on a 0°/180° FPGA interconnect layout.

FIG. 3 is an example pattern-matching run of the trifoil and coma aberration patterns on a 140×170 μm section of FPGA interconnect altered to appear and function as a phase-shift mask. The blue layout area represents 0-degree phase, red represents 180-degree phase, and black is chrome. Green in the pattern matches with 0 phase in the layout and red matches with 180 phase in the layout. A close-up of one of the trifoil match locations with match factor of 0.169 is shown. Coma match factors are as high as 0.34.

Figure 4:
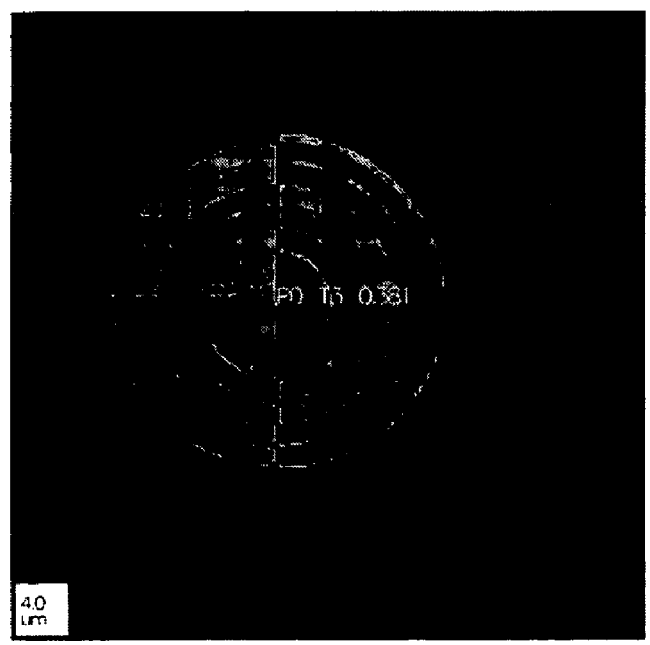
FIG. 4 illustrates a coma pattern matched on a mask layout with 45-degree edges.

Shown in FIG. 4 is the geometry that is sensitive to the coma aberration in a two-layer mask designed in a 0.5 μm technology. This layout includes 45-degree lines, demonstrating how the pattern matcher can handle non-Manhattan geometry. Any number of patterns can be processed in one matching run and either the top N matches or all matches above a user threshold are reported. The PC version of the software uses OpenGL graphics to provide the user with an interactive view of the layout with zoom, pan, show/hide layers, measurement tools, and screen captures of images such as those in FIGS. 3 and 4.

Figure 5:
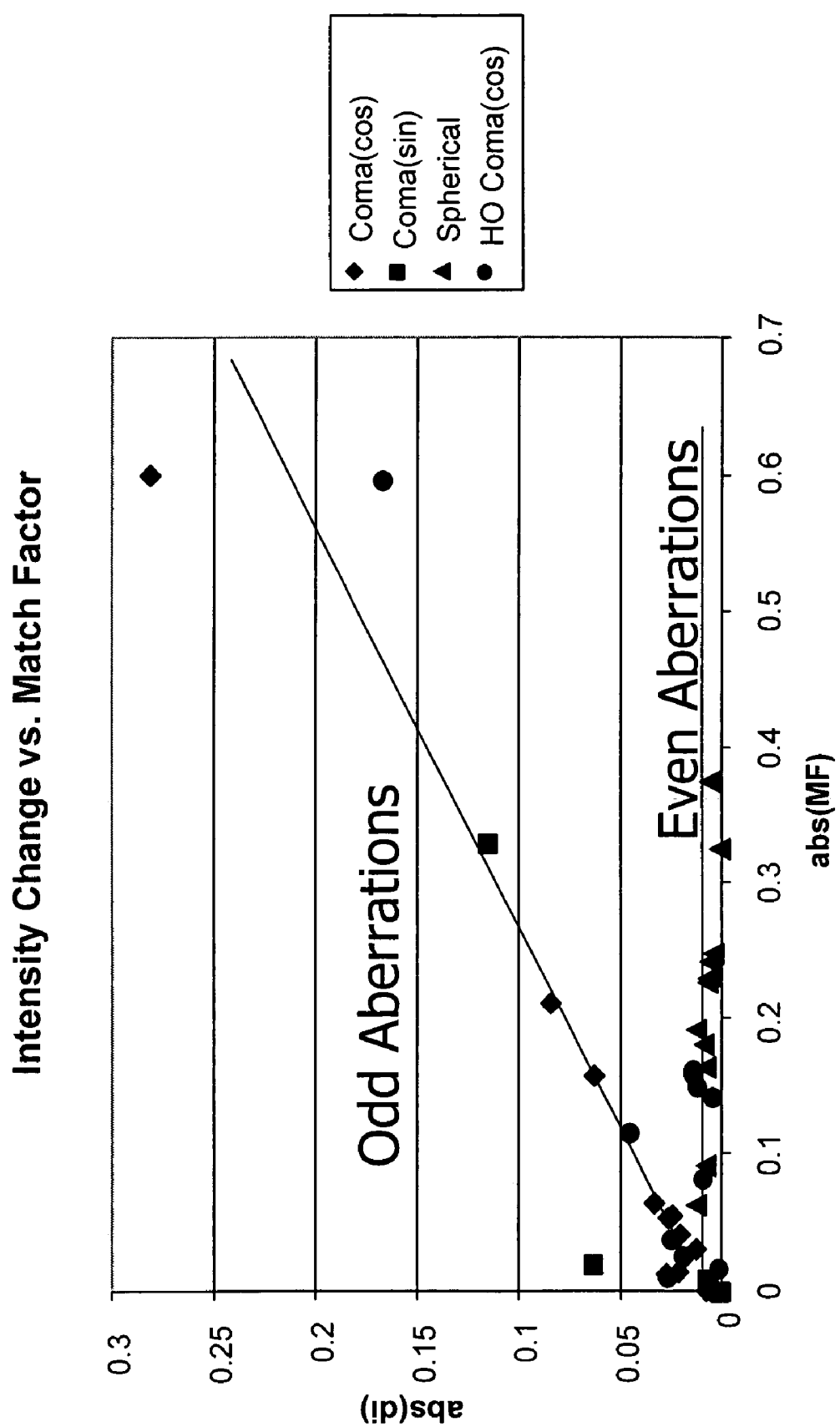
FIG. 5 is a graph illustrating simulated intensity change vs. match factor prediction for various aberration patterns and layouts.

Pattern-matching accuracy has been verified against aerial image intensity simulations obtained from SPLAT. FIG. 5 is a plot of simulated intensity change vs. normalized match factor for binary and 0/180-degree phase shift masks as calculated by the pattern-matching software. Odd aberrations show an approximate linear relationship between predicted and actual intensity changes, while even aberrations show little simulated intensity changes due to the electric fields of the intensity spillover adding in quadrature. The code has since been modified to take into account even and odd aberrations when computing the match factor by now performing the match using true complex numbers. Additional pattern-matching verification steps were performed in F. Gennari, G. Robins, and A. Neureuther, "Validation of the Aberration Pattern-Matching OPC Process," SPIE 4692B, March 2002.

The rectangle-based matching algorithm was tested on a number of large layouts in various technologies with one or more layers. These layouts were tested for sensitivity to the coma lens aberration and others. In all cases, the actual match time was proportional to the number of rectangles in the flattened layout (though it was not actually flattened) times the layout density. The density increased with the number of overlapping layers, but in actual mask layouts each layer would represent a different phase and thus would not overlap. Therefore, one layer is sufficient to demonstrate the matching performance. In the timing tests, an older 1 GHz Pentium III computer with 512 MB of RAM was used. The largest test layout consisted of the 234 MB GDSII file of the active area mask layout of a microprocessor with area 417 $mm^2$, eleven levels of hierarchy, and 35.3 million rectangles when flattened. The coma test pattern was a 128×128 bitmap with pixel size of 100 nm, and the layout contained 2.6 billion potential edge match points, though only about 20% of these points were tested due to filtering by an internal adaptive coherency/match factor prediction algorithm. The pattern matching software took 42 minutes of runtime and 140 MB of memory to read the layout, compute the top 1000 match locations, and display the results.

Following is a more detailed description of the algorithms and use thereof. As noted above, the goal of the pattern matching software is to quickly scan a large integrated circuit mask layout to determine locations that are sensitive to non-ideal processing effects such as lens aberrations. Given a pattern matrix of complex numbers representing the worst-case process effect, this is accomplished by using a pattern-matching algorithm that scans each point of interest in the layout in search of geometry closely resembling the shape of the pattern. The greater the similarity of the polygons in the layout to the shapes in the pattern, the higher its match factor (MF) will be. Thus an IC designer or process engineer can run the pattern matching system on a layer of an entire mask layout, record the areas sensitive to one or a combination of lens aberrations, and then use the results to modify the layout geometry. This procedure will reduce the effects of imperfect optics on the printing of the image from the mask to the wafer, improving the yield of the design. Alternatively, these areas predicted to be most affected by aberrations could be recorded and later used to reduce the locations that must be inspected in the printed layout. The idea of pattern matching can be extended to apply to other processing effects where a match pattern can be produced which represents the worst-case geometry. Such applications include misalignment, defects, flare, reflective notching, laser-assisted thermal processing, and Chemical-Mechanical Polishing (CMP) dishing.

Software System.

The user supplies a pattern function and layout on which to match, runs the software, and is presented with both graphical and textual feedback on the locations with highest match factors. In the case of lens aberrations, the pattern function is a set of Zernike polynomials that represent a combination of aberrations present in the optical system of interest. A pattern generation tool reads this Zernike file, takes the 2D inverse Fourier transform (IFT), and writes the pattern as a matrix of complex numbers.

Several layout formats can be read by the pattern-matching executable. In addition to the native layout format originally used for pattern matching, GDS2 and CIF layouts can be imported and stored in memory in hierarchical form. A tool is provided for flattening and conversion of GDS2 or CIF layouts to native pattern matcher format. The geometric shapes supported include rectangles, squares, polygons, paths, and circles. A layer definition file must also be provided to specify which input layers are used, what their weights and phases are, and how to display them.

There are several versions of the pattern-matching executable, which were designed to be used for different applications and on different types of computers. These include a text-based executable, a non-interactive graphical version that uses off-screen rendering, and an interactive graphical version. All three produce text files listing the values and locations of matches found. The graphical interface and resulting images allow the user to browse through the match locations and observe the geometries of interest. The images can also be displayed on a web page for remote execution of the pattern matching system.

Matching Algorithm.

The matching algorithm itself has three main steps. First, the input shapes are split into geometric primitives, shown in FIG. 6. Next, the primitives are spatially subdivided and sorted to permit efficient access to local areas of data. This includes partitioning the layout into smaller overlapping areas and locally flattening any hierarchy. It is possible to perform the sort and flattening operations either in memory or on disk. The primitives are sorted by Y-value and then by X-value, and may be grouped together spatially into sub-regions of a partition for fast access to local collections of shapes.

The third step is the matching loop for computing the match factor (MF), where all of the runtime is usually spent. The match factor is computed for each X,Y point of interest for each match type of each orientation of each pattern. The number of X,Y points tested depends on whether the user is searching all or part of the layout and if the match locations are specified to be corners, edges, line ends, or all points on a layout grid (typically ⅙ to ⅒ a feature size). Even if the points are constrained to lie on the edges of features, the number of test locations can be in the billions for a layout of several square centimeters. Therefore, it is critical to minimize the time taken to compute the match factor at a point. The time per point is equal to (1) the number of geometric primitives that overlap the pattern at that point times (2) the time taken to add the contribution of a primitive to the accumulated match factor. This assumes that (1) can be determined in time linear in the number of overlapping primitives, which is guaranteed by the spatial sorting. When choosing primitives to use in the matching algorithm, there is a tradeoff; using higher order primitives vastly reduces (1) but also increases (2). However, as shown in FIG. 7, the increase in (2) is more than offset by the order(s) of magnitude decrease in (1) with larger primitives. Example numbers for a typical layout and 128×128 pattern are shown in Table 1. Edge/rectangle strip primitives are much more efficiently than pixel primitives, and rectangle/triangle primitives are even better. The improved efficiency of using edges and rectangles comes at a cost of increased algorithm complexity and more special cases.

TABLE 1

Number and cost of geometric primitives

| Primitive | Average number in 128 × 128 pattern | Computational cost (operations)/primitive | Total cost |
|---|---|---|---|
| Pixel | 16384 | 1 | 16384 |
| Edge/Rectangle Strip | 600 | 2 | 1200 |
| Rectangle | 20 | 4 | 80 |
| Triangle* | 5 | 4–12 (average 5) | 20–60 (avg. 25) |

*Only in non-Manhattan layouts

Several additional steps are necessary for efficient pattern matching and to deal with special cases. In order to reduce the number of primitives in the layout, adjacent and compatible primitives on the same layer can be merged into one larger primitive. In some cases multiple shapes may overlap and an overlap removal step is necessary to ensure the contribution from overlapping shapes is not counted more than once. Finally, some applications of pattern matching and some methods of constraining the locations examined in a layout require Boolean operations (AND, OR, XOR, ANDNOT, EDGE, GROWBY) between two or more layers. In fact, the overlap removal procedure can be thought of as a special case of OR-ing one layer with itself. The user is able to specify other Boolean layer operations in the layer definition file. These layer Booleans are implemented differently for each primitive based on known algorithms that will not be discussed here.

Polygon Splitting.

Complex input shapes are difficult to store, access, and process quickly inside of the matching loop, and for this reason they are split into simpler elements as a preprocessing step. The input shapes are split into geometric primitives, which consist of pixels, edges, rectangles, and triangles depending on the matching method used. Input shapes include squares, rectangles, polygons, paths, and circles. Since each of these is either a type of polygon or can easily be converted into a polygon given a layout grid, explaining the procedure for the case of a polygon will be sufficient. The overall goal of the polygon splitting algorithm is to produce a minimal, non-overlapping set of smaller primitives that together cover the entire area inside the polygon and none of the area outside the polygon. Though the algorithm will work with self-intersecting and other special case polygons, these situations occur infrequently and the discussion of this case will be omitted. One note on self-intersecting polygons: processing is much easier if the intersection points are added into the list of polygon points if not already there.

Manhattan Polygons.

Figure 8:
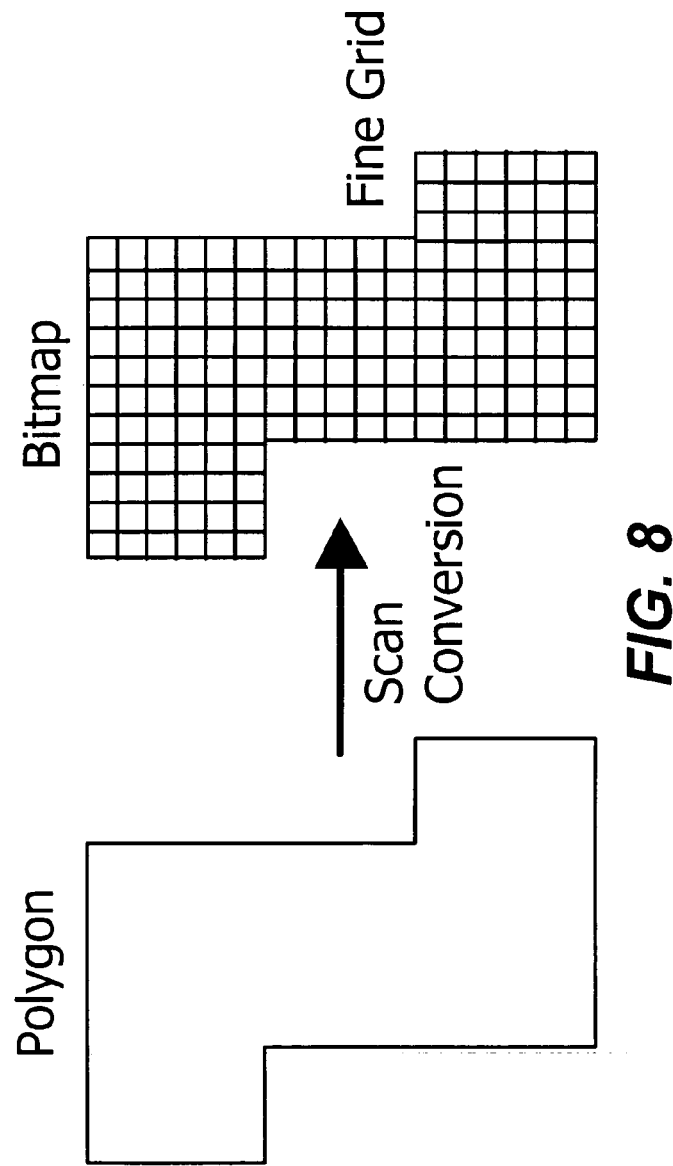
FIG. 8 illustrates polygon splitting using a bitmap.
Figure 9:
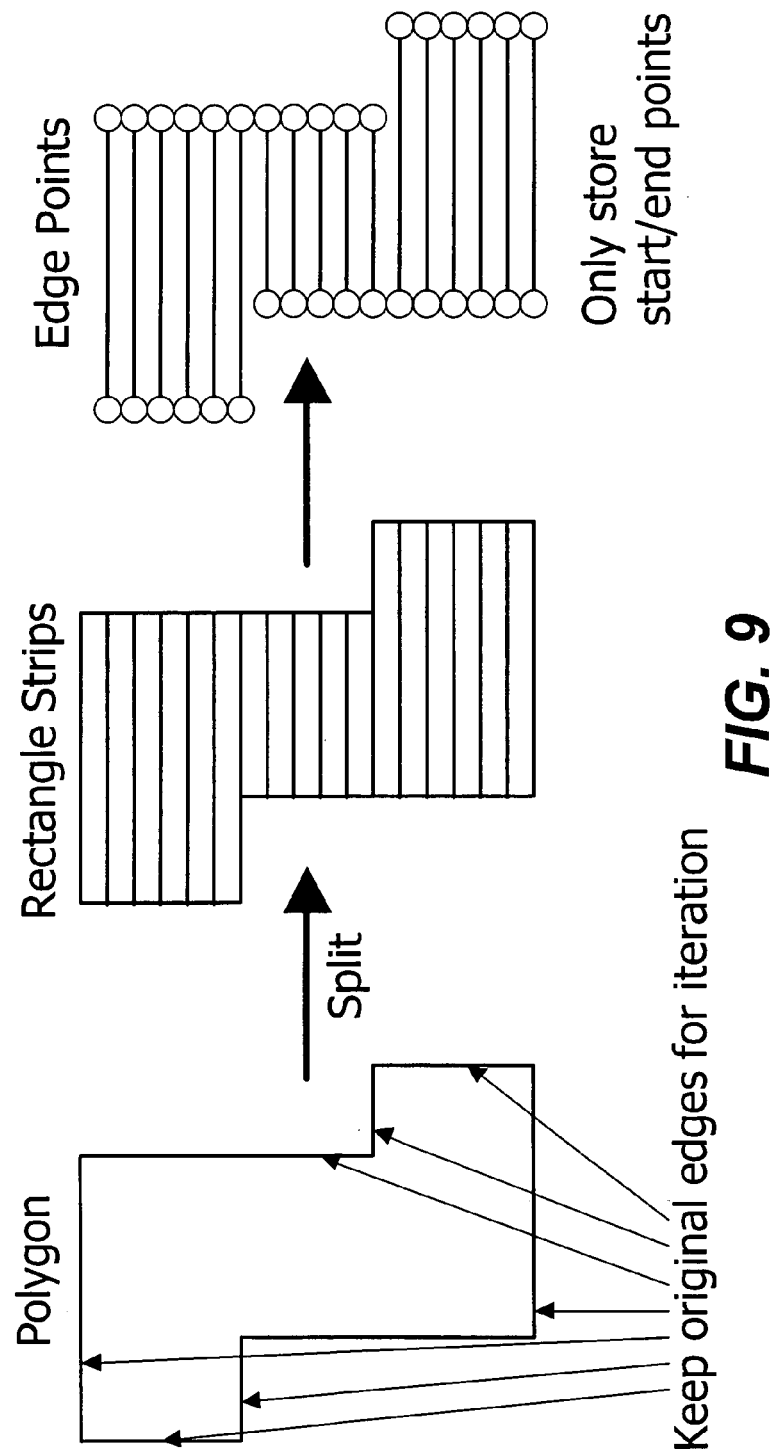
FIG. 9 illustrates polygon splitting using edges or rectangle strips.
Figure 10A:
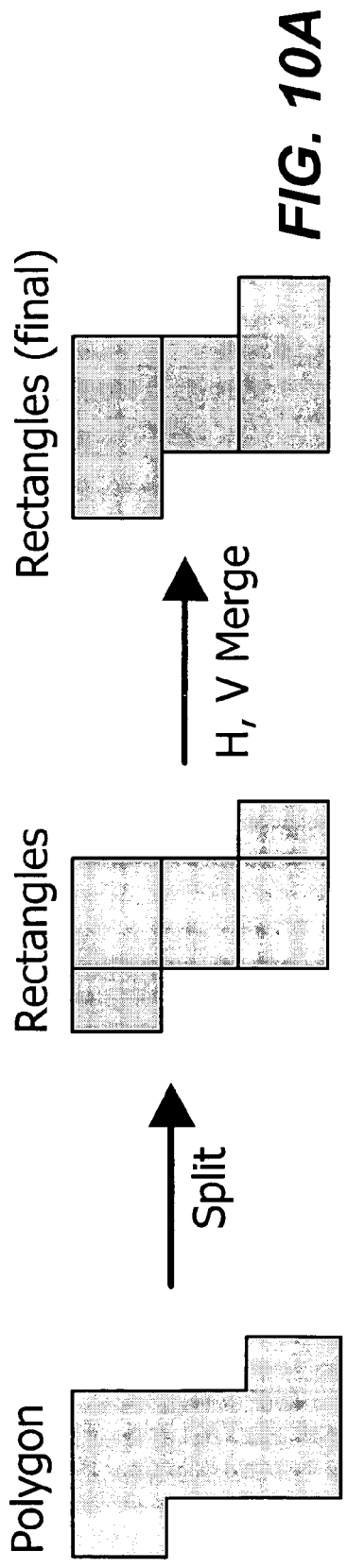
FIG. 10 illustrates polygon splitting using rectangles.
Figure 10B:
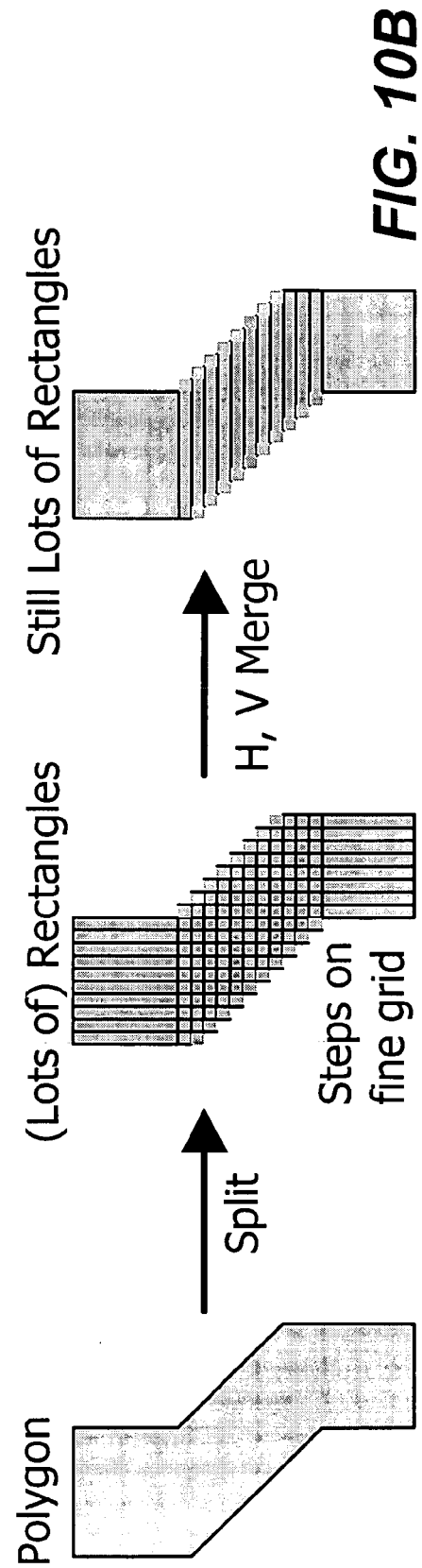

Most of the polygons found in an integrated circuit mask layout are Manhattan, consisting of alternating horizontal and vertical line segments with no diagonal edges. Many layouts contain only Manhattan geometry. These are the easiest to process, and the splitting procedure has been optimized for this case. The polygons are first split into rectangles that are snapped to the layout grid. To do this, the polygon's bounding box is divided by horizontal and vertical cutlines through each point in the polygon to produce a non-uniform grid. Each grid element that lies inside the polygon is extracted as a rectangle, and then merged with rectangles to the right and above to produce a small number of maximally expanded rectangles as shown in FIG. 10. If the bitmap algorithm is to be used, then the layer weight of each of the rectangles is added to the layout bitmap matrix through a scan conversion process such as that used in computer graphics, as shown in FIG. 8. Alternatively, if the edge intersection algorithm is used, then the rectangles are split into either horizontal or vertical strips one pixel wide that lie between two opposite edges of each rectangle, and adjacent edge strips are merged into a single larger edge strip, as shown in FIG. 9. The primitives are then sorted by X,Y position and stored in memory or on disk.

Non-Manhattan Polygons.

Figure 11:
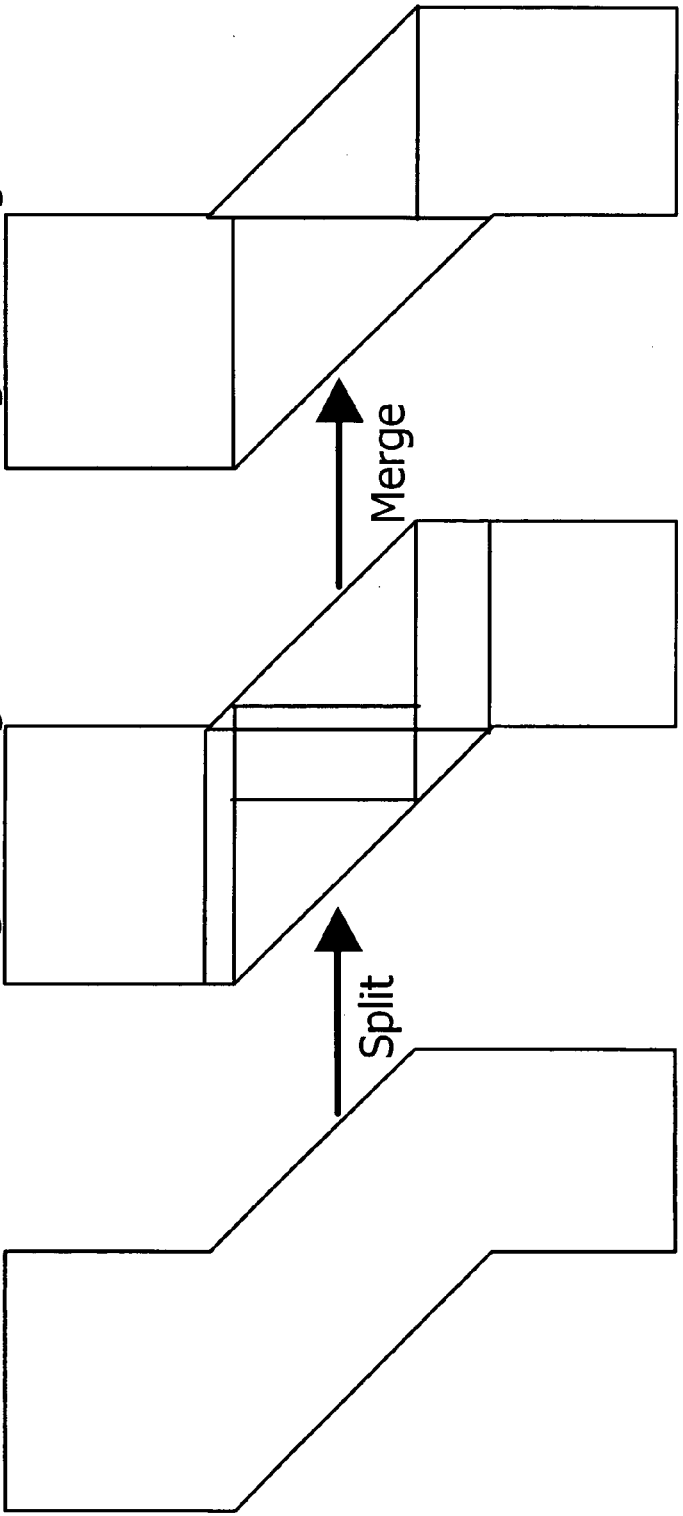
FIG. 11 illustrates polygon splitting using rectangles and triangles.

Polygons with diagonal lines pose a problem since they cannot be split directly into rectangles aligned with the X- and Y-axes. If the above algorithm were used, then some of the non-uniform grid elements would lie partially inside and partially outside of the polygon. There are two solutions to this problem: (1) Convert the diagonal edges into stair-step sequences of horizontal and vertical line segments discretized on the layout grid such as in scan conversion, resulting in a Manhattan polygon that can be split into a (potentially large) number of rectangles, or (2) Split the polygon into a small set of triangles as well as rectangles. For practical purposes the triangles must be constrained to be right triangles; otherwise the processing of arbitrary triangles becomes too complex and computationally expensive. Therefore, layouts with acute angles formed by two diagonal line segments inside of a single quadrant of the XY plane cannot be split into right triangles and muse be dealt with using method (1). When method (2) can be used, the number of resulting primitives is usually much lower that when using method (1) due to the large number of rectangles required to accurately approximate a diagonal edge. Thus method (2) is preferred whenever possible. The extraction of triangles from a polygon is similar to the extraction of rectangles, with a number of additional algorithm steps, and will not be discussed in detail here. See the polygon splitting shown in FIGS. 10 and 11, which demonstrate non-Manhattan polygon splitting into rectangles and triangles, respectively.

Pre-Integration.

One trick to speeding up the match factor computation is to avoid touching each of the many pixels in the pattern. Since the sum of pattern pixel values overlapping a polygon is required for the match factor, and iterating through each pixel is not desired, the pattern values must be rearranged so that the sum of a large number of pixels can be determined with only a few operations. In the extreme example where the pattern is entirely covered by a shape, then every pixel value in the pattern must be added up to determine the sum of pixels under the shape. Obviously, it is much better to sum up the pixels only once and then use that single number every time this situation occurs. Similarly, the sum of the right half of the pattern can be precomputed, stored, and used any time a shape overlaps exactly the right half of the pattern.

It may appear that there are an enormous number of pixel group combinations that must be stored in order to make this algorithm work. However, when a shape overlaps exactly the left half of the pattern; the sum of the pixels overlapping this area can be precomputed and stored, or it can be calculated by subtracting the sum of pixel values in the right side of the pattern from the total sum of pixels in the entire pattern. In this way a series of additions and subtractions of a small number N of carefully chosen pixel blocks will yield the area covered by an enormous number of actual pixel blocks. This is the basis of an algorithm that pre-integrates the pattern in various directions and allows a series of differences of pre-integrated table lookups to determine the sum of pixel values under a shape of arbitrary size and position.

In order to efficiently add contributions from edge/rectangle strips to the match factor, the pattern must be pre-integrated in 1D, either horizontally or vertically. The following embodiment assumes horizontal edge strips and thus horizontal pre-integration to the right, denoted by matrix IR. Each y row of the pattern value matrix (PV)=PV[0,0] to PV[Nx−1,Ny−1] is processed in sequence, and a row of a pre-integrated matrix IR is computed in a way such that IR[x,y]=sum from $\{i=x \text{ to } Nx-1\}$ of PV[i,y], or IR[x,y]=IR[x+1,y]+PV[x,y]. Each matrix element in IR is equal to the sum of all elements in PV at that location and to the right. Then, if a rectangle strip spans from location (x1,y) to (x2,y), instead of summing each pixel from x1 to x2 in row y using PV, the same number can be obtained from the difference IR[x1,y]−IR[x2,y]. The number of operations is reduced from (x2−x1) to 2.

Figure 12:
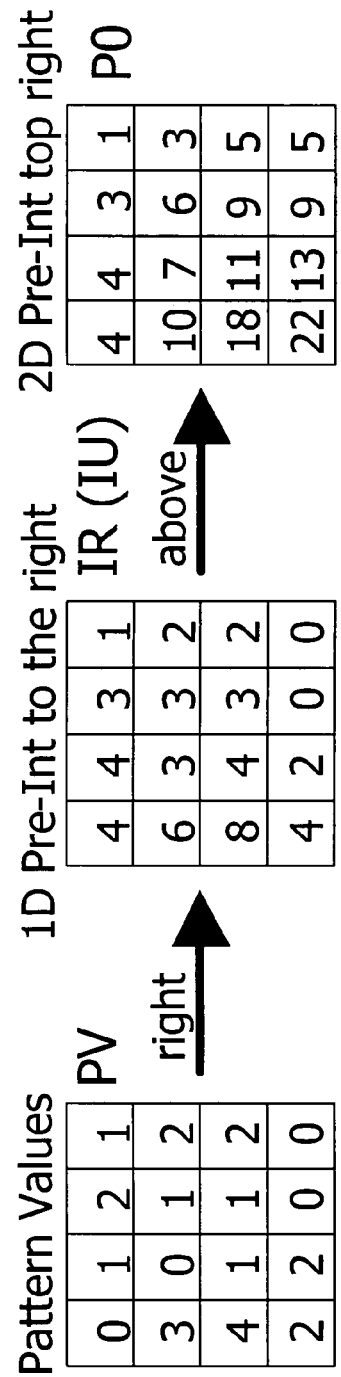
FIG. 12 illustrates 1D and 2D pattern pre-integration

How the pattern could be pre-integrated in 1D is described above. This can be extended to pre-integration in 2D so that rectangular blocks of pixel values are stored instead of only 1D strips. A 2D matrix (P0) pre-integrated to the right and above is obtained by taking IR and performing the 1D pre-integration in the Y-direction so that P0[x,y]= sum from $\{i=y \text{ to } Ny-1\}$ of IR[x,i], or P0[x,y]=P0[x,y+1]+ IR[x,y]. Each matrix element in P0 represents the sum of pattern values at that location and in the region above and to the right of that location. A graphical diagram and example of both 1D and 2D pre-integration is depicted in FIG. 12.

Matching Algorithms.

The bitmap algorithm is the simplest method for computing a match factor at each point, but it is also the slowest. In order to execute the inner matching loop, each input shape must be scan converted into a large bitmap, specifically a matrix of complex numbers representing the magnitude (transmittance) and phase of mask openings. The bitmap can be many gigapixels in size and sometimes must be split into smaller partitions in order to fit it in a realistic amount of memory. The match factor at a location is computed by iterating over every pixel inside the boundary of the pattern positioned at that location. Each complex number pixel in the layout is multiplied by the corresponding complex number pixel in the pattern, and every pixel's contribution is summed over the entire area.

Figure 13:
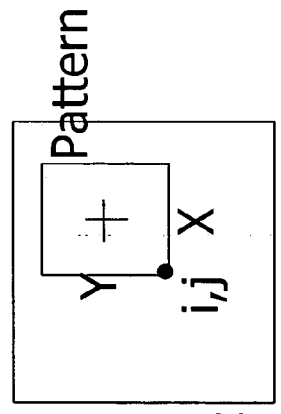
FIG. 13 illustrates a bitmap algorithm.
Figures 18A, 18B:
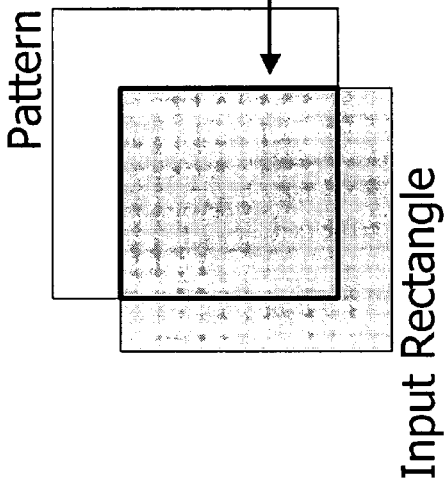
FIG. 18 illustrates an example of rectangle pattern integration (bitmap and edge).

Assume each complex number in the layout and pattern is purely real. If the layout pixel and pattern pixel have the same sign, then they match and a value equal to the product of the magnitudes (importance) of those pixels is added to the match factor, increasing the correlation. If the signs differ, then the match factor is similarly decreased. Zero pixels are "don't cares." Therefore, the closer a collection of layout shapes at the match location resembles the pattern shape, the higher its match factor will be. The equation used in the bitmap algorithm is shown in FIG. 13. An example of running the bitmap algorithm on a small pattern is shown in FIG. 18.

In the following description, the primitive is assumed to be completely inside the pattern area. If the primitive extends beyond the pattern boundaries, then it must be clipped. Clipping will be explained below.

Edge Intersection.

A useful observation can be made about the layout pixel values. Since the layout consists of only a few unique layers, for instance 0- and 180-degree phase mask regions, the layout pixels take on a discrete number of values. Moreover, these values appear together in large blocks of pixels because the grid resolution is usually much smaller than a feature size. This is especially true for large rectangle fills. Similarly, large areas of zero pixels, which denote the absence of a layer, are also common and can be skipped completely.

The following example demonstrates how this observation can be used to speed up the match factor computation. Assume that a large rectangle N pixels in width overlaps the pattern and extends from pattern column X to column X+N. Take a row Y in the pattern that lies between the top and bottom of the rectangle. If the pattern is pre-integrated to the right as described above, then one can compute the sum of the pattern values PV[X,Y] to PV[X+N,Y] with two operations: IR[X,Y]−IR[X+N,Y]. This pre-integrated value is then multiplied by the weight of the rectangle to yield the match factor from that horizontal strip of the rectangle in two operations instead of N. The contribution of the entire rectangle to the match factor is thus the sum of the contributions in each row Y contained in the rectangle. FIG. 14 demonstrates the edge intersection algorithm, and FIG. 18 provides a numerical example of the edge intersection algorithm on a small pattern.

Rectangle.

The edge intersection algorithm can be taken a step further for even more efficient addition of rectangle contributions to the match factor. If the pattern can be pre-integrated in 1D to allow 1D rectangle strips to be added efficiently, then the pattern can be pre-integrated again in an orthogonal direction to allow an entire 2D rectangle to be added even more efficiently.

The following description extends the example using the 2D pre-integration method. Refer to FIG. 15 for the steps involved in this example. Assume the rectangle extends from lower left corner X,Y to upper right corner X+N,Y+M. Utilizing the 2D pre-integration matrix P0, the sum of pattern pixel values under the rectangle can be computed starting with the sum of all pattern pixels above and to the right of the lower left corner of the rectangle. This may overestimate the size of the rectangle. The problem is corrected by subtracting off the sum of pattern pixels above and to the right of the upper left corner, and subtracting the sum of pattern pixels above and to the right of the lower right corner. Since some area has been subtracted twice, it must be corrected by adding the sum of pattern pixels above and to the right of the upper right corner of the rectangle. In summary, the sum of pattern pixel values under the rectangle is equal to P0[X,Y]−P0[X,Y+M]−P0[X+N,Y]+P0[X+N,Y+M]. This number is multiplied by the rectangle's layer weight to get the contribution of the entire rectangle to the match factor. This takes only four operations as opposed to N*M. A numerical example of the rectangle algorithm is also given in FIG. 19.

Triangle (45 Degree).

Some input layouts contain diagonal edges, usually with angles at multiples of 45 degrees where the technology allows. For example, permitting poly lines to run diagonally can lead to denser layout structures. These non-Manhattan polygons must be split into a very large number of rectangles to accurately model the sloped edges. This problem was presented above. In many cases, right triangles can be used to replace these large collections of tiny rectangles in efficiently representing a diagonal polygon edge. The number of primitives will often be reduced to a fraction of the size of the required rectangle set. However convenient this may seem, it comes at a price: triangles are much more complex to process and involve the computation and storage of a large number of pre-integration matrices.

In the case of 45-degree triangles, eight 2D pre-integration matrices are used, four for each quadrant (P0, P1, P2, P3) and four for each of the lower octants (O1, O2, O3, O4). See FIG. 16 for a diagram of the area (angular rotations) covered by these pre-integrations. There are a number of other possible combinations, including using only six matrices with added computation steps, but they will not be discussed here. These matrices are pre-computed for 90- and 45-degree angular regions beginning at a point in the pattern and continuing to the edges of the pattern matrix. Pixels that lie exactly on a diagonal edge can be fully counted, not counted at all, or counted as one half their actual pattern value for highest accuracy.

Figure 16:
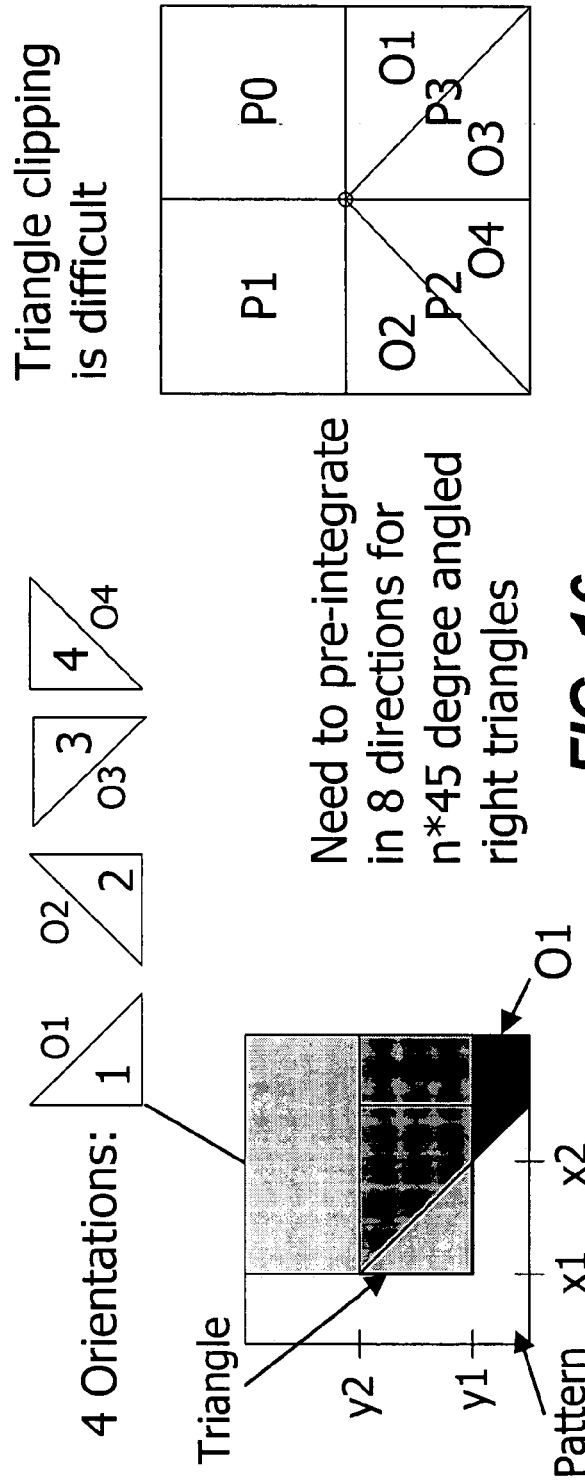
FIG. 16 illustrates a triangle algorithm.

There are four possible right triangle orientations corresponding to four unique positions of the right angle. The remainder of this section will assume the triangle is oriented with its right angle in the lower left corner and its hypotenuse oriented from the upper left to the lower right. FIG. 16 explains the steps involved in using the triangle algorithm for triangles in this orientation, and an example is provided. First, the P0 pre-integration matrix is used to retrieve the sum of pattern pixel values above and to the right of the triangle's right angle point at x1,y1. Then P0 at the top left corner (x1,y2) of the triangle is subtracted, leaving an area of pattern pixel values that extends from the left vertical leg of the triangle to the right side of the pattern area and includes the entire triangle. Next, the value of O1 of the top left (x1,y2) triangle point is subtracted to remove the pattern pixel values to the right of the triangle's diagonal edge. This operation subtracts a 45-degree angular slice of the pattern between the angles of 315 and 360 degrees. Since this area may extend beyond the bottom of the triangle, the extra area must be added back in and is equal to the value of O1 at the lower right (x2,y1) corner of the triangle. Thus four operations are involved: P0(x1,y1)−P0(x1,y2)−O1(x1,y2)+O1(x2,y1).

Triangle (Non-45 Degree)

The above triangle algorithm is capable of processing triangles with angles at multiples of 45 degrees. A problem arises when a polygon contains an angle that is not a multiple of 45 degrees. In fact, even a 45-degree polygon can be split into non 45-degree right triangles if the original polygon does not lie on the layout grid used for triangulation. Grid rounding error can result in a pixel or two shift in edge and corner locations, thus perturbing the angle. The triangle algorithm previously described cannot be used in these situations.

Figure 20:
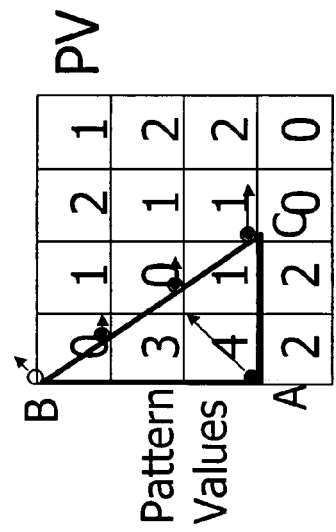
FIG. 20 illustrates an example of triangle (non-45 degree) pattern computation.
Figure 21:
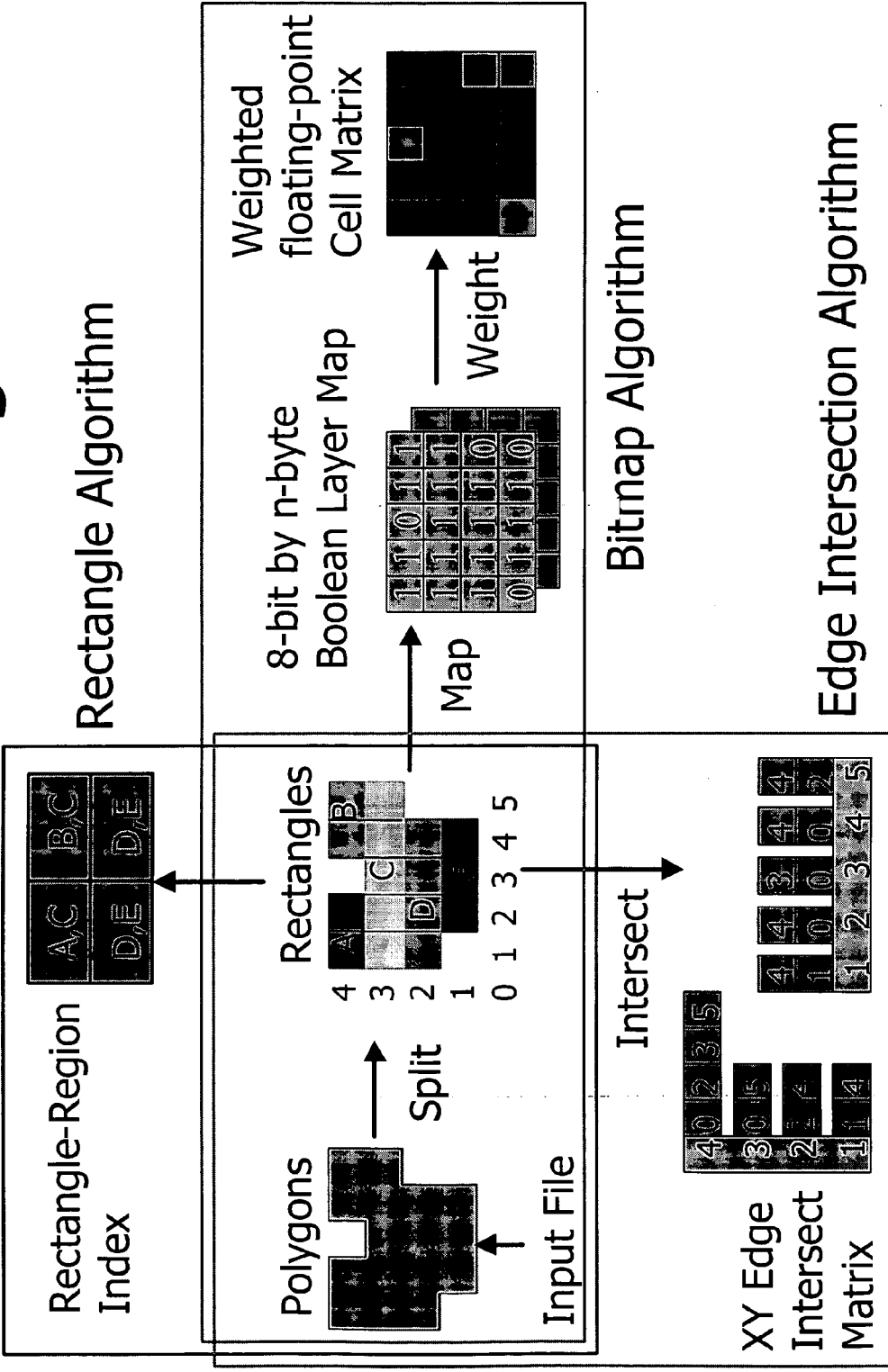
FIG. 21 illustrates data structures and application of bitmap, edge, and rectangle algorithms.

These triangles can still be processed more efficiently than if they were split into many small, single pixel width rectangles. One method to do this is to use a combination of both the rectangle algorithm and the edge intersection algorithm. The contribution of the rectangle representing the bounding box of the triangle extended to the vertical edge of the pattern opposite the triangle's hypotenuse is first computed. This area includes pixels that are not in the triangle. To correct for this, the pixels between the hypotenuse of the triangle and the opposite vertical edge of the pattern boundary can be subtracted in horizontal strips. This can be done using the pre-integration matrix from the edge algorithm (IR or IL, integrated left). The difference between this step and the edge algorithm is that the strip runs to the vertical edge of the pattern, and thus the pre-integrated value at the end of the edge is zero and the computation can be omitted. If the height of the triangle is H, then the number of operations performed is equal to H+2. FIG. 20 shows an example of how this algorithm is applied to a small pattern.

The improvement in speed is not as impressive as in the 45-degree triangle algorithm. If rectangles are used instead of triangles then the number of operations is 4*H, and the number of operations is 2*H for the edge intersection algorithm. The real advantage of using this approach is that it greatly reduces the number of primitives, which in turn reduces the computation time for pre-processing the data and the memory required to store the primitives.

Figure 19:
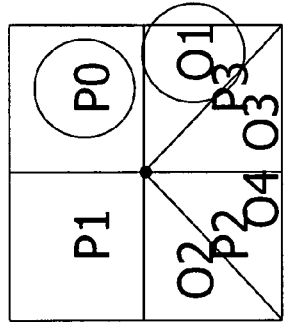
FIG. 19 illustrates an example of rectangle and triangle (45 degree) pattern computation.

FIGS. 18, 19, and 20 demonstrate the various algorithms using a simple pattern and a single primitive.

Clipping.

One problem with the matching algorithms as presented above occurs when the primitive shape only partially overlaps the pattern area. If the shape extends beyond the pattern area, then lookups in the pre-integration tables outside of the computed region will fail. This means that the shapes must be clipped to the pattern area before the table lookups are performed. In the case of edges and rectangles, these primitives are easily clipped to the bounding box of the pattern using min( ) and max( ) to yield a primitive of the same type.

However, a minor problem arises when clipping a triangle to a rectangular area. Consider the triangle clipped to the pattern box in FIG. 17. The intersection of the two shapes is no longer a triangle; it is a five-sided polygon. This shape must be further split on the fly into smaller shapes consisting of a possible smaller triangle of the same orientation and up to two new rectangles. There are a number of cases to consider when splitting the polygon resulting from clipping, but fortunately these cases can be enumerated efficiently without having to resort to the slow arbitrary non-Manhattan polygon splitting algorithm described above. The contribution from each of the resulting primitives is then added to the match factor in the usual way for rectangles and triangles as discussed above. The worst-case number of operations required to add the contribution of a 45-degree right triangle to the match factor is therefore actually 12, since each of up to three shapes requires four operations.

There has been described new algorithms for use in pattern matching which increase efficiency and accuracy and reduce the time required in computing match factors.

The invention has been described with reference to mask layouts, but the invention has applicability in other image or polygon comparisons such as handwriting recognition, for example. Thus, while the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method for locating areas in a mask layout of an integrated circuit which are impacted by aberrations in projection printing comprising the steps of:
    a) generating a description of a mask layout wherein the layout is partitioned into rectangles and triangles,
    b) generating a description of an aberration function wherein the description of the aberration function is modeled as producing spillover between mask openings with a localized pattern that is the inverse Fourier transform of the optical path difference function in the pupil of the projection printing system,
    c) sequentially comparing the aberration function to the mask layout geometry as the mask layout is scanned using an algorithm based on polygons in the mask layout, the polygons in the mask layout being partitioned into rectangles and triangles and the rectangles and triangles in the mask layout being compared with the aberration function, and wherein each pixel in a rectangle or triangle has a cumulative weight based on the pattern pixel weight in the rectangular or triangular region above and to one side of the weighted pixel, and including rank ordering all mask layout edges, corners, and other geometries according to degree of similarity to the aberration function, and
    d) identifying any area in the mask layout tending to match the aberration function.

2. The method as defined by claim 1 wherein step d) rank orders locations based on match factors of the layout geometry and the aberration function.

3. The method as defined by claim 1 and further including step e) modifying the mask layout in response to identified matches with an aberration function.

4. The method as defined by claim 3 wherein step b) includes generating descriptions of a plurality of aberration functions and step c) compares the plurality of aberration functions to the mask layout.

5. The method as defined in claim 1 wherein step b) includes generating descriptions of a plurality of aberration functions and step c) compares the plurality of aberration functions to the mask layout.

6. A method for locating areas in a mask layout of an integrated circuit comprising the steps of:
    a) generating a description of a mask layout,
    b) generating a description of a search pattern,
    c) sequentially comparing the search pattern to the mask layout as the mask layout is scanned using an algorithm based on polygons in the mask layout, the polygons in the mask layout being partitioned into rectangles and the rectangles in the mask layout being compared to the description of the search pattern, and wherein each pixel in a rectangle has a cumulative weight based on the pattern pixel weight in the rectangular region above and to one side of the weighted pixel, and
    d) identifying any area in the mask layout tending to match the search pattern.

7. The method as defined by claim 6 wherein step c) rank orders all mask layout edges, corners, and other geometries according to degree of similarity to the search pattern.

8. The method as defined by claim 7 wherein the description of the search pattern is an aberration function modeled as producing spillover between mask openings with a localized pattern that is the inverse Fourier transform of the optical path difference function in the pupil of the projection printing system.

9. The method as defined by claim 6 wherein polygons are split into rectangles utilizing a core matching procedure.

10. The method as defined by claim 9 wherein the polygons are split into rectangles, the entire input layout is partitioned into groups of rectangles, and the edges and corners are extracted from the rectangles and used to filter the match locations.

11. The method as defined by claim 9 wherein step d) rank orders locations based on match factors of the layout geometry and the search pattern.

12. The method as defined by claim 9 and further including step e) modifying the mask layout in response to identified matches with the search pattern.

13. The method as defined by claim 12 wherein step b) includes generating descriptions of a plurality of search patterns and step c) compares the plurality of search patterns to the mask layout.

14. The method as defined in claim 6 wherein step b) includes generating descriptions of a plurality of search patterns and step c) compares the plurality of search patterns to the mask layout.

15. The method as defined by claim 6 wherein in step a) the mask layout is partitioned into rectangles and triangles and step c) compares rectangles and triangles in the mask layout to the description of the search pattern.

16. The method of claim 6 wherein the search pattern comprises rectangles extracted from an image.

17. The method of claim 16 wherein the image is a Scanning Electron Micrograph (SEM) image of a layout.

18. The method of claim 6 wherein the search pattern comprises a collection of polygons.

19. The method as defined by claim 6 wherein the search pattern is a layout clip.

20. A method for comparing one handwriting image to another handwriting image comprising the steps of:
 a) generating a description of a first handwriting image in mask form,
 b) generating a description of a second handwriting image in mask form, and
 c) sequentially comparing the second image description to the first image description to identify areas of similarity or dissimilarity, the comparing being based on corresponding geometrical patterns, including rectangles and triangles, in the first and second images.

21. The method as defined by claim 20 wherein the geometric patterns are lines in the images.

22. The method as defined by claim 20 wherein the geometric patterns include rectangles in the images.

23. In a process for comparing geometric shapes in a mask layout to a description of a search pattern, a method for defining the geometric shapes comprising the steps of:
 a) cumulatively weighting pixels in each geometric shape wherein a pixel value for a rectangle has a cumulative weight based on pixel weight in the rectangular region above and to one side of the weighted pixel, and
 b) storing only the cumulative weights for selected pixels.

24. The method as defined by claim 23 wherein the pixel values for a line are cumulatively weighted along the line whereby a weight for a line segment is obtained from a beginning pixel value and an end pixel value for the line segment.

25. A method for locating areas in a mask layout of an integrated circuit comprising the steps of:
 a) generating a description of a mask layout,
 b) generating a description of a search pattern,
 c) sequentially comparing the search pattern to the mask layout as the mask layout is scanned using an algorithm based on polygons in the mask layout, the polygons in the mask layout being partitioned into triangles and the triangles in the mask layout being compared to the description of the search pattern, and wherein each pixel in a triangle has a cumulative weight based on the pattern pixel weight in the triangular region above and to one side of the weighted pixel, and
 d) identifying any area in the mask layout tending to match the search pattern.

26. In a process for comparing geometric shapes in a mask layout to a description of a search pattern, a method for defining the geometric shapes comprising the steps of:
 a) cumulatively weighting pixels in each geometric shape wherein a pixel value for a triangle has a cumulative weight based on the pixel weight in the triangular region above and to one side of the weighted pixel, and
 b) storing only the cumulative weights for selected pixels.

* * * * *